United States Patent
Hosek et al.

(10) Patent No.: US 11,633,854 B2
(45) Date of Patent: Apr. 25, 2023

(54) SYSTEM AND METHOD FOR DETECTION AND CORRECTION OF ROBOT PAYLOAD POSITION

(71) Applicant: Persimmon Technologies, Corp., Wakefield, MA (US)

(72) Inventors: Martin Hosek, Lowell, MA (US); Scott Wilkas, Lexington, MA (US); Sripati Sah, Wakefield, MA (US); Itsui Yamayoshi, Bedford, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 165 days.

(21) Appl. No.: 16/455,909

(22) Filed: Jun. 28, 2019

(65) Prior Publication Data

US 2020/0009727 A1 Jan. 9, 2020

Related U.S. Application Data

(60) Provisional application No. 62/693,673, filed on Jul. 3, 2018.

(51) Int. Cl.
*B25J 9/16* (2006.01)

(52) U.S. Cl.
CPC ........... *B25J 9/1653* (2013.01); *B25J 9/1664* (2013.01); *B25J 9/1692* (2013.01); *B25J 9/1694* (2013.01)

(58) Field of Classification Search
CPC ...... B25J 9/1653; B25J 9/1664; B25J 9/1692; B25J 9/1694; H01L 21/67259; H01L 21/67748; H01L 21/681; H01L 21/67778; H01L 21/67787; H01L 21/68; H01L 21/67184; H01L 21/67271; G05B 2219/37286; G05B 2219/37359; Y10S 414/135

See application file for complete search history.

(56) References Cited

U.S. PATENT DOCUMENTS

| | | | |
|---|---|---|---|
| 6,195,619 B1 * | 2/2001 | Ren | G03F 7/7075 702/155 |
| 6,629,053 B1 * | 9/2003 | Mooring | G05B 19/401 702/149 |
| 9,196,518 B1 | 11/2015 | Hofmeister et al. | |
| 2003/0168173 A1 * | 9/2003 | Tamura | C23C 14/566 156/345.31 |
| 2004/0067127 A1 * | 4/2004 | Hofmeister | H01L 21/681 414/744.5 |
| 2010/0121487 A1 * | 5/2010 | Kawaguchi | H01L 21/67742 700/228 |
| 2013/0085595 A1 * | 4/2013 | Kiley | H01L 21/67259 700/121 |
| 2014/0365011 A1 * | 12/2014 | Hosek | B25J 9/1682 700/259 |
| 2016/0136812 A1 * | 5/2016 | Hosek | B25J 9/1638 700/254 |
| 2016/0137416 A1 | 5/2016 | Toebes et al. | |

* cited by examiner

*Primary Examiner* — Abby Y Lin
*Assistant Examiner* — Dylan M Katz
(74) *Attorney, Agent, or Firm* — Harrington & Smith

(57) ABSTRACT

Disclosed herein is a method. The method includes moving a payload through a motion path proximate at least one sensor. Detecting edges of the payload such that at least three points on at least two edges are detected. Capturing a position when the at least one sensor detects at least one edge of the payload.

20 Claims, 9 Drawing Sheets

SYSTEM AND METHOD FOR DETECTION AND CORRECTION OF ROBOT PAYLOAD POSITION

CROSS REFERENCE TO RELATED APPLICATION

This application claims priority under 35 USC 119(e) on provisional application No. 62/693,673 filed Jul. 3, 2018 which is hereby incorporated by reference in its entirety.

BACKGROUND

Technical Field

The exemplary and non-limiting embodiments relate generally to a system and method for determining a position of a polygonal payload on a robot end-effector and, if configured so, utilizing the position for delivering the payload to a specified location.

Brief Description of Prior Developments

The existing manufacturing processes for semiconductor, LCD and LED products typically utilize automated cluster tools to process material in the form of various types of substrates.

A top view of an example cluster tool 10 is depicted diagrammatically in FIG. 1. The tool 10 may consist of a vacuum chamber 12 with a plurality of stations 14, such as load-locks and process modules, attached to the circumference of the chamber 12. A material-handling robot 16 may be located in the chamber to cycle material through the tool 10, for example, from the load-lock(s) through the process module(s) and back to the load-lock(s).

The material typically rests on a set of pads integrated into the end-effector 18 of the robot 16, and is held in place merely by the means of frictional force. An active gripper, a common solution in many robotic applications, may not be used in a vacuum cluster tool 10 due to the risk of contamination of the material by particles resulting from moving components close to the material and sliding motion associated with the gripping action.

In the absence of a gripper, the material is not mechanically aligned on the end-effector 18 when the robot picks the material, and the material may end up displaced (misaligned) from its ideal nominal location on the robot end-effector. In order to understand whether the position of the material on the end-effector is acceptable and, if possible, correct for misalignment of the material when the robot delivers the material, a solution is needed for determining the position of the material on the robot end-effector and, if desired, utilizing the position for delivering the material to a specified location.

SUMMARY

The following summary is merely intended to be exemplary. The summary is not intended to limit the scope of the claims.

In accordance with one aspect, an example method includes moving a payload through a motion path proximate at least one sensor. Detecting edges of the payload such that at least three points on at least two edges are detected. Capturing a position when the at least one sensor detects at least one edge of the payload.

In accordance with another example, an example embodiment is provided in an apparatus comprising an end-effector, at least one sensor, and a controller. The end-effector is configured to move a payload. The at least one sensor is configured to detect edges of the payload. The controller includes at least one processor and at least one non-transitory memory including computer program code, the at least one memory and the computer program code configured to, with the at least one processor, cause the apparatus to move the payload through a motion path proximate the at least one sensor, detect the edges of the payload such that at least three points on at least two edges are detected, and capture a position when the at least one sensor detects at least one edge of the payload.

In accordance with another example, an example embodiment is provided in a non-transitory program storage device readable by a machine, tangibly embodying a program of instructions executable by the machine for performing operations comprising moving a payload through a motion path proximate at least one sensor, detecting edges of the payload such that at least three points on at least two edges are detected, and capturing a position when the at least one sensor detects at least one edge of the payload.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
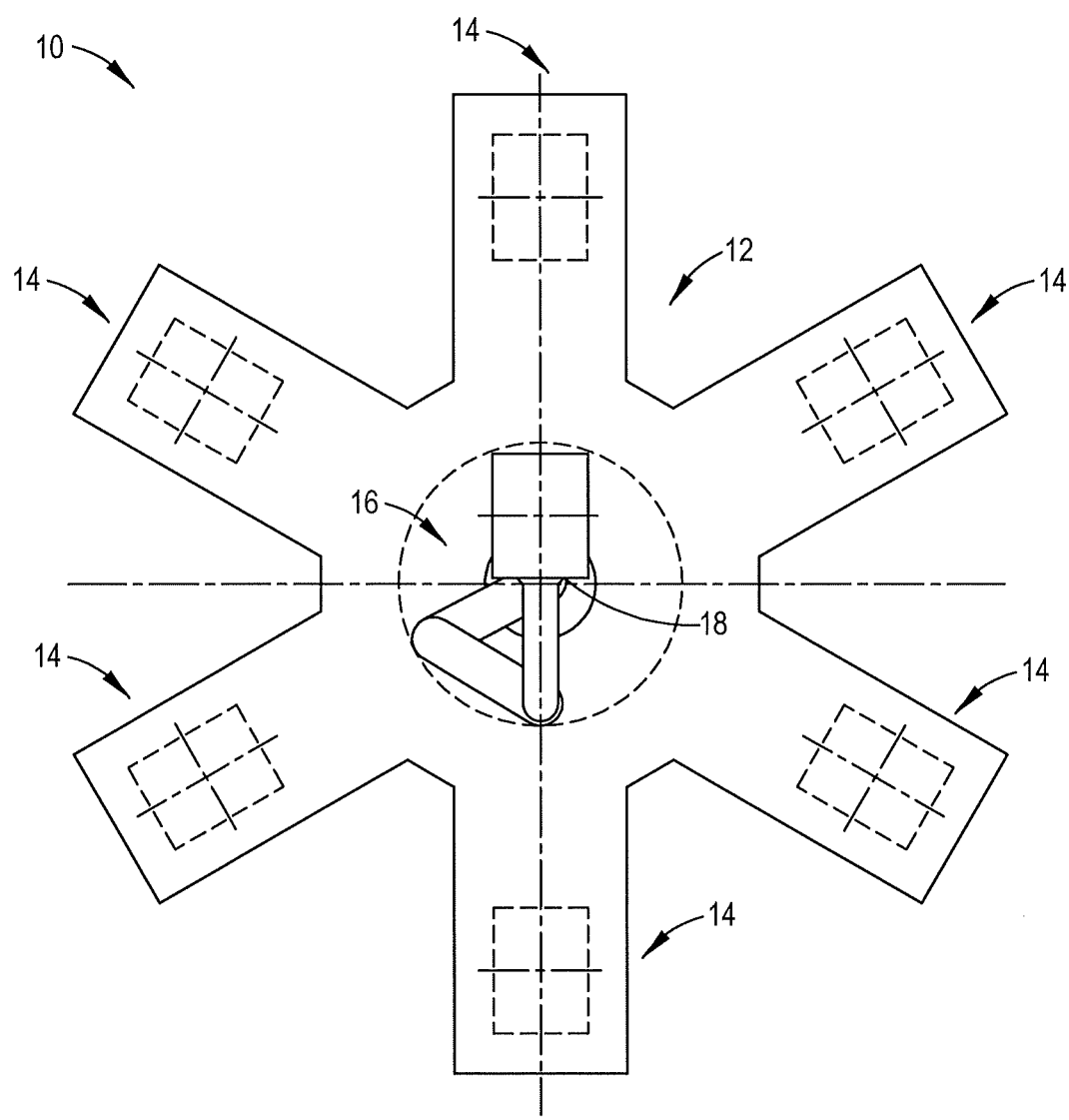
FIG. 1 is a top view of a cluster tool.
Figure 6:
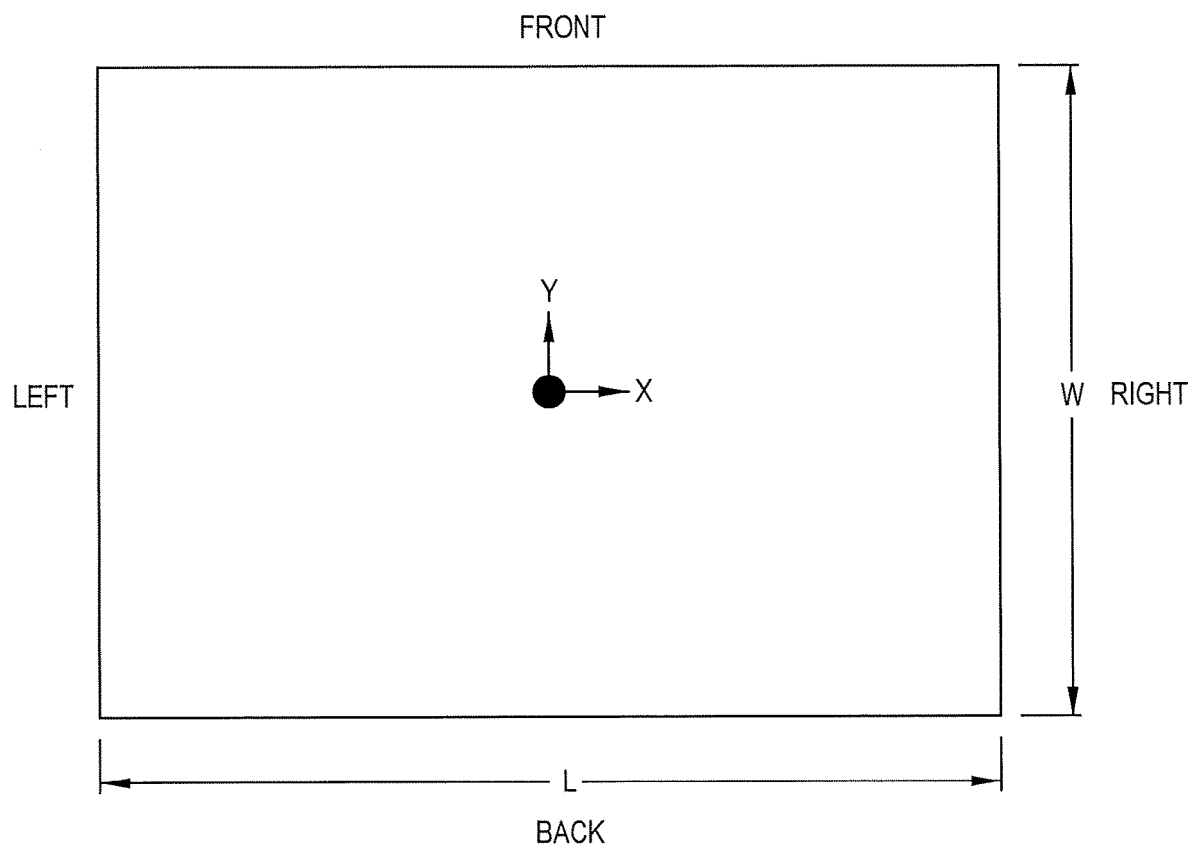
FIG. 6 is an illustration corresponding to an optimization problem for the payload and end-effector.

The following abbreviations/symbols that may be found in the specification and/or the drawing figures are defined as follows:

$c_F, c_B$—Constants used in equations for front/back sides of rectangle representing payload
$c_L, c_R$—Constants used in equations for left/right sides of rectangle representing payload
$H_i$—Householder reflector matrix
$m$—Number of data points for all edges
$m_F, m_B$—Number of data points for front/back edges
$m_L, m_R$—Number of data points for left/right edges
$n_1, n_2$—Define vectors normal to lines of rectangle representing payload
$r_{adj}, \phi_{adj}$—Polar coordinates of adjusted destination position of robot end-effector
$r_{EE}, \phi_{EE}$—Polar coordinates of captured end-effector positions in robot coordinate system
$r_{sen}, \phi_{sen}$—Polar coordinates of sensor locations in robot coordinate system
$r_{stn}, \phi_{stn}$—Polar coordinates of robot station in robot coordinate system $v_i$—Vectors to sensor locations at trigger expressed in end-effector coordinate system W,L—Width and length of rectangular payload (see FIG. 6)

$x'_g, y_g$—Coordinates of the back edge data points in end-effector coordinate system $x_p, y_p$—Offset of payload in end-effector coordinate system $x_F, y_F$—Coordinates of the front edge data points in end-effector coordinate system $x_i, y_i$—Coordinates of vectors $v_i$ in end-effector coordinate system $x_L, y_L$—Coordinates of the left edge data points in end-effector coordinate system $x_R, y_R$—Coordinates of the right edge data points in end-effector coordinate system $\theta_p$—Orientation of payload in end-effector coordinate system $\xi_{EE}, \eta_{EE}$—Cartesian coordinates of captured end-effector positions in robot coordinate system $\xi_{sen}, \eta_{sen}$—Cartesian coordinates of sensor locations in robot coordinate system Various embodiments of the system and method according to the present invention are intended to address the above requirements. In contrast to the state-of-the-art methods, the present invention addresses the requirements without additional mechanical complexity and with minimum impact on tool throughput. Although the features will be described with reference to the example embodiments shown in the drawings, it should be understood that features can be embodied in many alternate forms of embodiments. In addition, any suitable size, shape or type of elements or materials could be used.

In one example embodiment, the present invention includes a cluster tool 100 having a vacuum chamber 12 with a plurality of stations 14 attached to the circumference of the chamber 12. A material-handling robot 16 having and end-effector 18 is located in the chamber to cycle material through the tool 100. The cluster tool 100 further comprises one or more sensors 20 located near one or more stations 14 and configured so that the sensors 20 can detect edges of a payload 22 carried by the robot 16 as the robot extends from the retracted position in the chamber 12 to the extended position in the station 14, as depicted diagrammatically in FIG. 2. In the particular example of FIG. 2, two sensors 20 per station 14 are shown. The sensors 14 may be, for instance, optical through-beam sensors, optical reflective sensors or any other suitable sensors capable of detecting the edges of the payload 22.

One feature according to various exemplary embodiments of the present invention, the motion path of the robot 16 between the retracted and extended positions may be carefully planned so that multiple edges of the payload can be detected by the sensors 20. Referring to FIG. 3, the motion path between the retracted position of diagram (a) and the extended position of diagram (h) may be, for example, of a zigzag shape, and the shape may be selected so that the sensors 20 can detect the leading edge 24, the right edge 26, the left edge 28 and the trailing edge 30 of the payload 22.

For instance, referring still to FIG. 3, the shape of the motion path 32 from the retracted position of diagram (a) to the extended position of diagram (h) may be selected so that sensors 20 can detect the leading edge 24 of the payload when the payload 22 enters the sensors 20, as shown in diagram (b), the right edge 26 of the payload when the payload leaves the right sensor, as depicted in diagram (c), the right edge 26 of the payload again when the payload enters the right sensor, as depicted in diagram (d), the left edge 28 of the payload 22 as the payload leaves the left sensor, as depicted in diagram (e), the left edge 28 of the payload again when the payload enters the left sensor, as depicted in diagram (1), and the trailing edge 30 of the payload as the payload leaves the sensors, as depicted in diagram (g).

Figure 4:
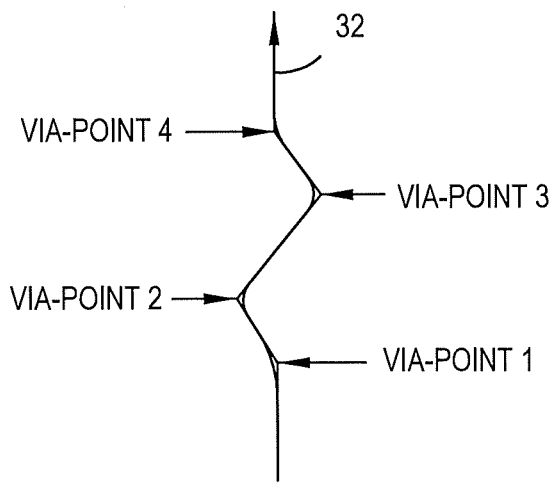
FIG. 4 is an illustration of an exemplary motion path.

As an example, the desired shape of the motion path 32 may be obtained by setting four via-points between the retracted position of diagram (a) and the extended position of diagram (h) and connecting the retracted position, the via-points and the extended position by straight-line segments, which may be blended into a single smooth motion path. The construction of such an example motion path 32 is illustrated in FIG. 4. The blending of the straight-line segments may be achieved, for instance, by decomposing the motion along the straight-line segments into two orthogonal components in a Cartesian coordinate system, and then overlapping and superimposing final portions of one segment with initial portions of the next segment in time. The resulting smooth and uninterrupted motion is critical in order to minimize the duration of the motion from the retracted position to the extended position, thus minimizing the impact on throughput (the number of wafers processed by the cluster tool per hour).

When any of the sensors 20 detects any of the edges of the payload 22 (detection or trigger event), the controller 34 of the robot 16 may capture the position, i.e., the coordinates, of the end-effector of the robot. This may be achieved, for instance, by capturing the positions of the joints of the robot and converting the positions of the joints of the robot to the position of the end-effector using the kinematic equations associated with the robot.

Figure 5:
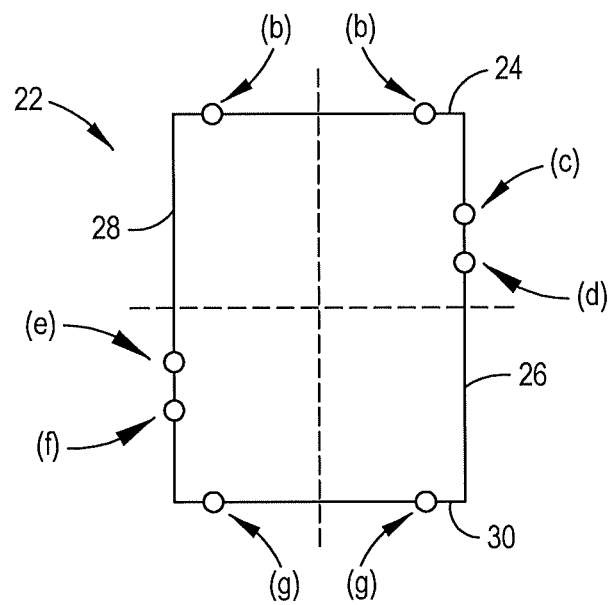
FIG. 5 is an illustration of distinct points on a circumference of a payload.

The information obtained in the above steps may be utilized to construct several points on the circumference of the payload, each point corresponding to one edge detection event. Considering the configuration of FIG. 3 as an example, eight distinct points on the circumference of the payload may be determined, as shown in FIG. 5. In FIG. 5, the points on the circumference of the payload are labeled in accordance with the edge detection events represented by the diagrams of FIG. 3. For instance, point (c) in FIG. 5 corresponds to the edge detection event represented by diagram (c) in FIG. 3.

The locations of the points on the circumference of the payload may be expressed, for example, in terms of two coordinates in a coordinate system attached to the end-effector of the robot. The coordinates of the points on the circumference of the payload may then be used to estimate the position of the payload on the robot end-effector. An example approach for estimating the position of the payload on the robot end-effector is provided next.

The points on the circumference of the payload that correspond to the edge detection events may be represented as follows:

$$v_i = (x_i, y_i), i = 1, 2, \ldots m \quad (1a)$$

where $$\xi_i = (x_{sen,i} - x_{EE,i}) \cos(\alpha_i) - (y_{sen,i} - y_{EE,i}) \sin(\alpha_i), i = 1, 2, \ldots, m \quad (1b)$$

$$\eta_i = (x_{sen,i} - x_{EE,i}) \sin(\alpha_i) + (y_{sen,i} - y_{EE,i}) \cos(\alpha_i), i = 1, 2, \ldots, m \quad (1c)$$

In Equation (1b), $\xi_{EE,i}$ and $\eta_{EE,i}$ are Cartesian coordinates of the end-effector of the robot in the robot coordinate system when a sensor detects an edge of the payload, $\alpha_{EE,i}$ is orientation of the end-effector of the robot in the robot coordinate system when the sensor detects the edge of the payload, and $\xi_{sen,i}$ and $\eta_{sen,i}$ are Cartesian coordinates of the sensor associated with the detection event, also expressed in the robot coordinate system. If polar coordinate system is used, the Cartesian coordinates needed for Equations (1b) and (1c) can be obtained from the polar coordinates using the following conversions:

$$\xi_{EE,i}=r_{EE,i}\sin(\phi_{EE,i}), \eta_{EE,i}=r_{EE,i} \cos (\phi_{EE,i}), i=1, 2,\ldots,m \quad (1d)$$

$$\xi_{sen,i}=r_{sen,i} \sin (\phi_{sen,i}), \eta_{sen}=r_{sen,i} \cos (\phi_{sen,i}), i=1, 2,\ldots,m \quad (1e)$$

where $r_{EE,i}$ and $\phi_{EE,i}$ are polar coordinates of the end-effector of the robot in the robot coordinate system when a sensor detects the edges of the payload, and $r_{EE,i}$ and $\phi_{EE,i}$ are polar coordinates of the sensor associated with the detection event, also expressed in the robot coordinate system.

If the end-effector of the robot is constrained mechanically to point in the radial direction, such as in the example of FIG. 3, the orientation of the end-effector is a function of the Cartesian coordinates of the end-effector of the robot:

$$\alpha_i = \alpha \tan (x_{EE,i}/y_{EE,i}) \quad (1f)$$

Or, utilizing a polar coordinate system, the orientation of the end-effector for Equations (1b) and (1c) can be obtained simply as:

$$\alpha_i = \phi_{EE,i} \quad (1g)$$

Figure 7:
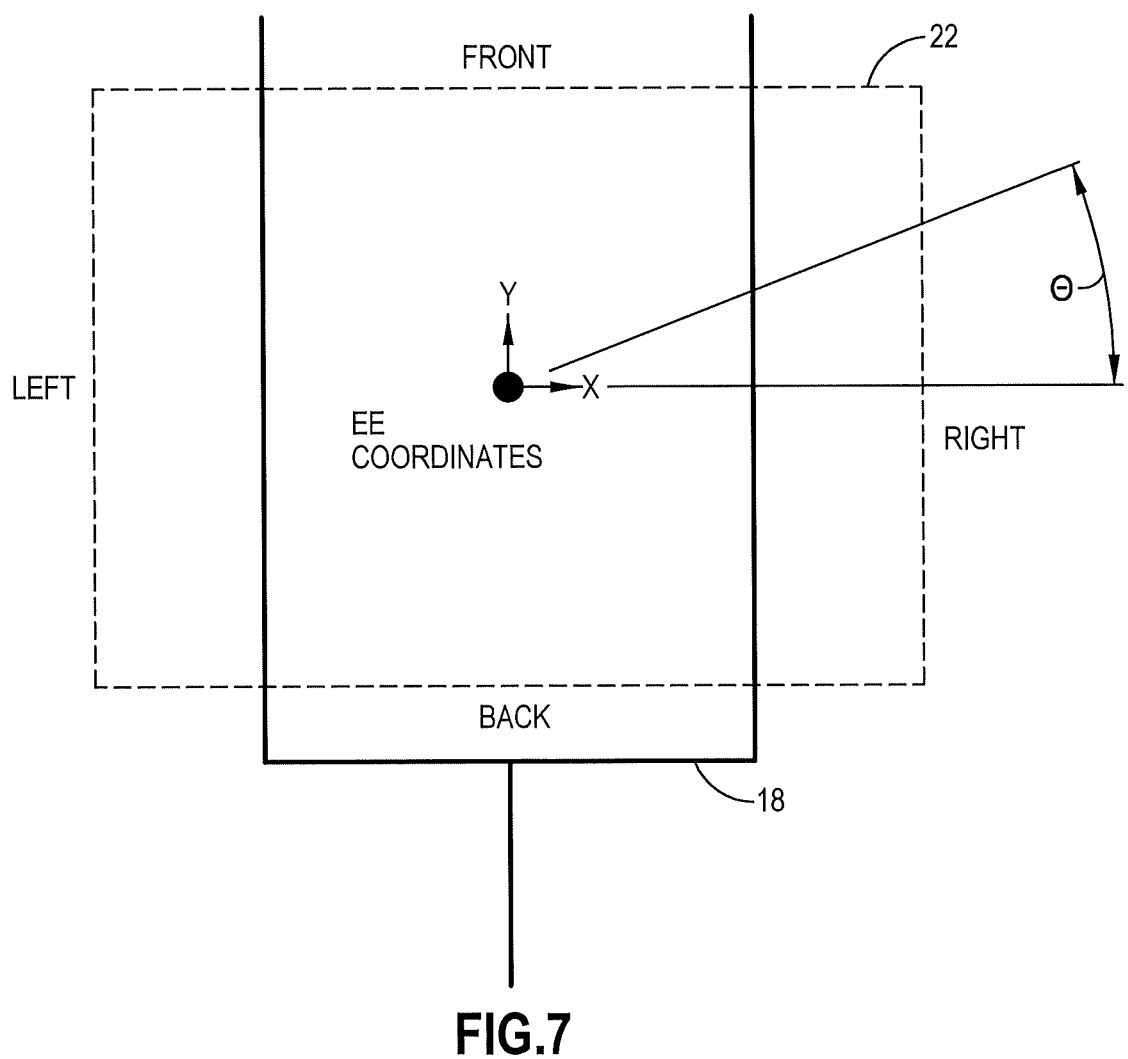
FIGS. 7 and 8 illustrate orientations of the payload and end-effector.
Figure 8:
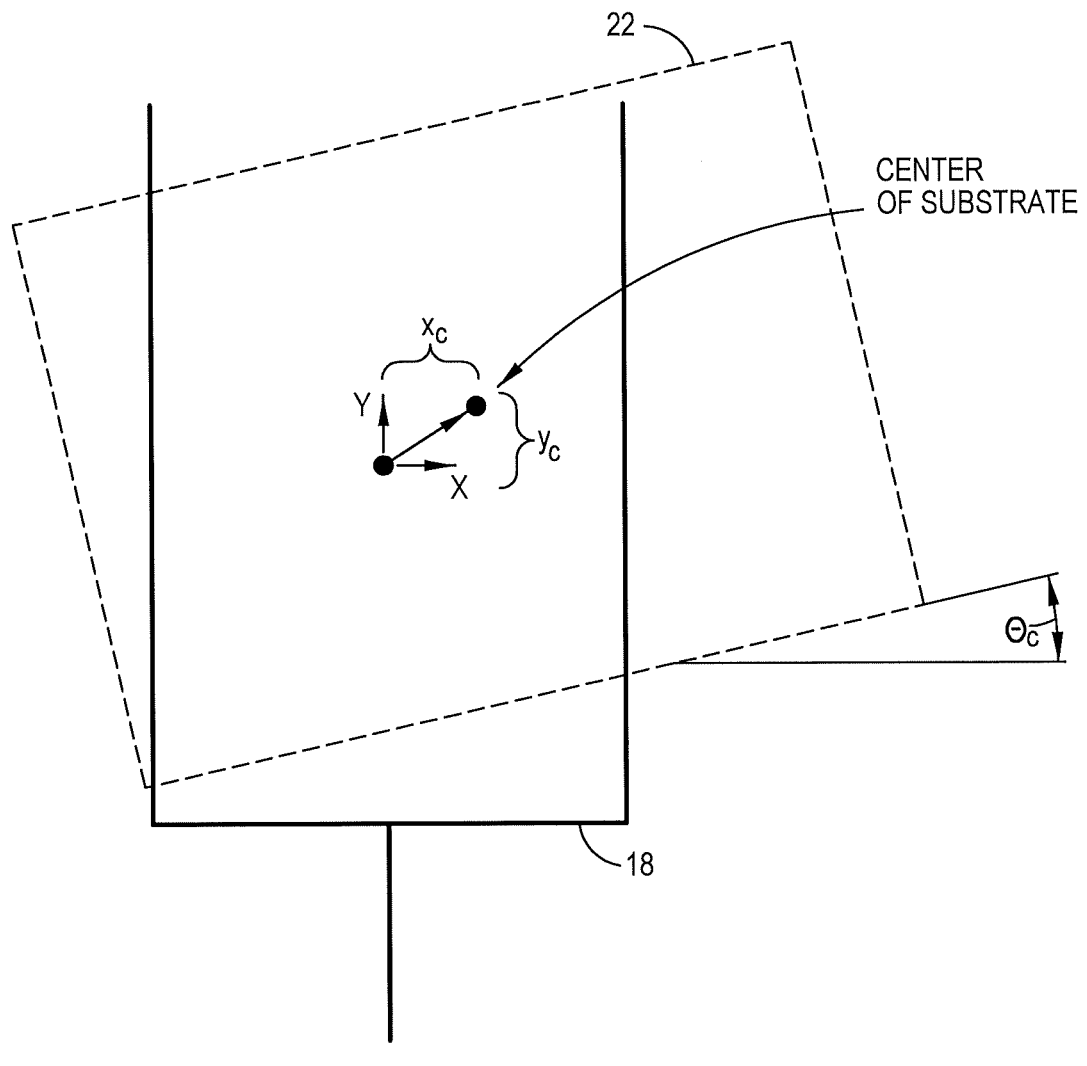

The general form of the problem to be solved can be stated as follows: Fit a rectangle of length L and width W (see FIGS. 6 and 7) to the set of points defined by $v_i$, $i=1, 2, \ldots, m$ captured at edges of the payload. Determine the positional offset $x_p$, $y_p$ and rotational offset $\theta_p$ of the rectangle (see FIG. 8). As an example, a solution may be derived using the following approach:

Determine the edge of the rectangle (Front, Back, Left or Right) that the data points, i.e., the captured positions of the end-effector, correspond to. Note that the front and back edges are equivalent to the leading and trailing edges introduced earlier in the text.

Formulate an optimization problem where the objective is to minimize the distances of the data points to the corresponding edge.

Frame the optimization as a least squares problem.

Perform Householder algorithm to obtain QR decomposed version of the least squares problem.

Solve the resulting set of linear equation one equation at a time (by back-substituting variables).

In order to find the rectangle that best fits the set of data points, the edge that the data points correspond to have to be determined. As an example, the robot may have this information pre-defined based on the motion of the robot and the maximum possible offsets. Using this information, the initial data points may be converted to the following expressions:

$$(x_i, y_i) = \begin{cases} (x_{F,j} \quad y_{F,j}), & j = 1, 2, \ldots, m_F \\ (x_{B,k} \quad y_{B,k}), & k = 1, 2, \ldots, m_B \\ (x_{R,l} \quad y_{R,l}), & l = 1, 2, \ldots, m_R \\ (x_{L,h} \quad y_{L,h}), & h = 1, 2, \ldots, m_L \end{cases} \quad (2)$$

Next, the cost function for the optimization problem needs to be constructed. The general equations that define the lines (sides) of the rectangle that represents the payload can be written as:

$$n_1 x + n_2 y + c - 0; c = \begin{cases} c_F & \text{for front edge} \\ c_B & \text{for back edge} \end{cases} \quad (3)$$

$$n_2 x + n_1 y + c - 0; c = \begin{cases} c_R & \text{for front edge} \\ c_L & \text{for back edge} \end{cases} \quad (4)$$

The front/back and left/right edges are constrained by the size of the rectangle (in other words, the distance between the front and back edges is equal to W, and the distance between the left and front edges is equal to L, as shown in FIG. 6). This constraint may be described by the following expressions:

$$\frac{|c_B - c_F|}{\sqrt{n_1^2 + n_2^2}} = W, \quad \frac{|c_L - c_R|}{\sqrt{n_1^2 + n_2^2}} = L \quad (5)$$

Using Equations (2) to (4), the sums of the squared distances between the data points and the corresponding edges may be described by the following expressions:

$$\text{Front}: \sum_{j=1}^{m_F} \frac{(n_1 x_{F,j} + n_2 y_{F,j} + c_F)^2}{n_1^2 + n_2^2}, \quad \text{Back}: \sum_{k=1}^{m_B} \frac{(n_1 x_{B,h} + n_2 y_{B,h} + c_B)^2}{\sqrt{n_1^2 + n_2^2}} \quad (6)$$

$$\text{Right}: \sum_{l=1}^{m_R} \frac{(n_2 x_{R,l} + n_1 y_{R,l} + c_R)^2}{n_1^2 + n_2^2}, \quad \text{Left}: \sum_{h=1}^{m_L} \frac{(n_2 x_{L,h} + n_1 y_{L,h} + c_B)^2}{n_1^2 + n_2^2} \quad (7)$$

Utilizing the constraints described in Equation (5), the expressions of Equations (6) and (7) can be rewritten as:

$$\text{Front}: \sum_{j=1}^{m_F} \frac{\left(n_1 x_{F,j} + n_2 y_{F,j} + c_B - W\sqrt{n_1^2 + n_2^2}\right)^2}{n_1^2 + n_2^2} \quad (8)$$

$$\text{Right}: \sum_{l=1}^{m_F} \frac{\left(n_1 x_{R,l} + n_2 y_{R,l} + c_L - L\sqrt{n_1^2 + n_2^2}\right)^2}{n_1^2 + n_2^2} \quad (9)$$

A magnitude constraint on the normal vectors may be added to make the solution unique. The constraint may be defined by the following expression:

$$n_1^2 + n_2^2 = 1 \quad (10)$$

Combining Equations (6) to (10), the following optimization problem may be formulated:

$$\min_{n_{1,2}, c_B, c_L} \left( \sum_{j=1}^{m_F} (n_1 x_{F,j} + n_2 y_{F,j} + c_B - W)^2 + \sum_{k=1}^{m_B} (n_1 x_{B,k} + n_2 y_{B,k} + c_B)^2 + \sum_{l=1}^{m_R} (n_2 x_{R,l} + n_1 y_{R,l} + c_L - L)^2 + \sum_{h=1}^{m_L} (n_2 x_{L,h} + n_1 y_{L,h} + c_L)^2 \right) \quad (11)$$

The expression of Equation (11) may be written in a matrix form:

$$\min \left\| \underbrace{\begin{bmatrix} 1 & 0 & x_{F,1} & y_{F,1} \\ \vdots & \vdots & \vdots & \vdots \\ 1 & 0 & x_{F,m_F} & y_{F,m_F} \\ 1 & 0 & x_{B,1} & y_{B,1} \\ \vdots & \vdots & \vdots & \vdots \\ 1 & 0 & x_{B,m_B} & y_{B,m_B} \\ 0 & 1 & -y_{R,1} & x_{R,1} \\ \vdots & \vdots & \vdots & \vdots \\ 0 & 1 & -y_{R,m_R} & x_{R,m_R} \\ 0 & 1 & -y_{L,1} & x_{L,1} \\ \vdots & \vdots & \vdots & \vdots \\ 0 & 1 & -y_{L,m_L} & x_{L,m_L} \end{bmatrix}}_{A} \cdot \begin{bmatrix} c_R \\ c_L \\ n_1 \\ n_2 \end{bmatrix} - \underbrace{\begin{bmatrix} W \\ \vdots \\ W \\ 0 \\ \vdots \\ 0 \\ L \\ \vdots \\ L \\ 0 \\ \vdots \\ 0 \end{bmatrix}}_{b} \right\|_2^2 \quad \text{s.t.} \; n_1^2 + n_2^2 = 1 \quad (12)$$

Or:

$$\min \|A \cdot \bar{z} - b\|_2^2 \; s.t. \; n_1^2 + n_2^2 = 1 \quad (13)$$

Equation (13) represents a constrained least squares problem, which can be solved using various methods. As an example, the problem can be solved by performing QR decomposition on the matrix A through Householder transformations.

For the purpose of explaining the QR decomposition through Householder transformations, variables A, $\bar{z}$, and b may be generalized as follows:

$$A = \begin{bmatrix} a_{11} & \cdots & a_{1n} \\ \vdots & \ddots & \vdots \\ a_{mn} & \cdots & a_{mn} \end{bmatrix}, \bar{z} = \begin{bmatrix} z_1 \\ \vdots \\ z_n \end{bmatrix}, b = \begin{bmatrix} b_1 \\ \vdots \\ b_m \end{bmatrix} \quad (14)$$

The QR decomposition decomposes matrix A into two matrices, Q an a R. Q is a matrix with orthonormal columns and R is an upper-triangular matrix with non-zero diagonal. The problem thus may be converted to the format of Equation (18) below.

$$A \cdot \bar{z} \cong b \quad (15)$$

$$Q \cdot R \cdot z_{opt} = b \quad (16)$$

$$Q^{-1} \cdot Q \cdot R \cdot z_{out} = Q - 1 \cdot b \quad (17)$$

$$R \cdot z_{out} = Q^T \cdot b = \tilde{b} \quad (18)$$

Let's introduce matrix Ã and make its elements identical to matrix A:

$$\tilde{A} := A \quad (19)$$

For i=1 to n, carry out the following steps:

$$v_i = w + \text{sign}(w_1) \cdot \|(w)\| \cdot e_1; w = \tilde{a}_{i:m,i} \quad (20)$$

$$u_t = \frac{v_i}{|v_i|} \quad (21)$$

$$H_i = \begin{bmatrix} I_{i-1} & 0_{1,n+1-i} \\ 0_{n+1-i,1} & I_{n+1-i} & 2(u_i \cdot u_i^T) \end{bmatrix} \quad (22)$$

$$\tilde{A} := H_i \cdot \tilde{A}, \text{ overwriting the values of } \tilde{A} \text{ for next iteration} \quad (23)$$

As a result, the following matrices are obtained:

$$H_1, H_2, \ldots, H_n \quad (24)$$

The matrices of (24) may be used to calculate R and $\tilde{b}$ through the following expressions:

$$R = \underbrace{H_n \cdot H_3, \ldots, H_2 \cdot H_1}_{Q_T} \cdot A \quad (25)$$

$$\tilde{b} = \underbrace{H_n \cdot H_3, \ldots, H_2 \cdot H_1}_{Q_T} \cdot b \quad (26)$$

The values calculated using Equations (25) and (26) may be substituted into Equation (18), which then can be written in the following expanded form:

$$\begin{bmatrix} r_{11} & r_{12} & r_{13} & r_{14} \\ 0 & r_{22} & r_{23} & r_{24} \\ \vdots & 0 & r_{33} & r_{34} \\ \vdots & \vdots & 0 & r_{44} \\ \vdots & \vdots & \vdots & 0 \\ \vdots & \vdots & \vdots & \vdots \\ 0 & 0 & 0 & 0 \end{bmatrix} \begin{bmatrix} c_B \\ c_L \\ n_1 \\ n_2 \end{bmatrix} = \begin{bmatrix} \tilde{b}_1 \\ \tilde{b}_2 \\ \tilde{b}_3 \\ \tilde{b}_4 \\ \vdots \\ \tilde{b}_m \end{bmatrix} \quad (27)$$

Equation (27) can be solved for the four unknowns $n_1$, $n_2$, $c_L$ and $c_B$ through back-substitution:

$$n_2 = \frac{\tilde{b}_4}{r_{44}} \quad (28)$$

$$n_1 = \frac{\tilde{b}_3 - r_{34} * n_2}{r_{33}} \quad (29)$$

$$C_L = \frac{\tilde{b}_2 - r_{23} * n_1 - r_{24} * n_2}{r_{22}} \quad (30)$$

$$C_B = \frac{\tilde{b}_1 - r_{12} * c_L - r_{13} * n_1 - r_{14} * n_2}{r_{22}} \quad (31)$$

Finally, the offsets of the payload expressed in the end-effector coordinate system may be calculated as:

$$x_c = n_1 * \left(-c_B + \frac{W}{2}\right) + n_2 * \left(-c_L + \frac{L}{2}\right) \quad (32)$$

$$y_C = n_2 * \left(-c_B + \frac{W}{2}\right) - n_1 * \left(-c_L + \frac{L}{2}\right) \quad (33)$$

$$\theta_c = \text{atan}(-n_1, n_2) \quad (34)$$

where x, and y, are coordinates of a reference point on the payload, e.g., the center of the payload, and $\theta_c$ is the orientation of the payload, all expressed in the end-effector coordinate system.

The resulting information may be used to detect an unacceptable, e.g., excessive, misalignment of the payload on the robot end-effector, and react accordingly, e.g., by aborting the robot motion. The resulting information may also be used to compensate for misalignment of the payload on the robot end-effector by adjusting the position of the robot end-effector when the payload is delivered so that it is delivered properly to the specified location regardless of the misalignment.

As an example, if the robot can control the orientation of the end-effector, the misalignment of the payload on the robot end-effector can be completely compensated for by adjusting the destination position of the robot end-effector according to the following expressions:

$$x_{adj}=, y_{adj}=, \theta_{adj}=-\theta_c \quad (35)$$

where $x_{adj}$, $y_{adj}$ are Cartesian coordinates and $\theta_{adj}$ is orientation of the robot end-effector in the adjusted destination position, and $x_{stn}$ and $y_{stn}$ are Cartesian coordinates of the robot station, all expressed in the robot coordinate system. The adjusted destination position of the robot end-effector may be obtained in terms of polar coordinates as follows:

$$r_{adj}=, \phi_{adj}=, \theta_{adj}=-\theta_c \quad (36)$$

where $r_{adj}$, $\phi_{adj}$ are polar coordinates and $\theta_{adj}$ is orientation of the robot end-effector in the adjusted destination position, and $r_{stn}$ and $\phi_{stn}$ are polar coordinates of the robot station, all expressed in the robot coordinate system.

If the robot cannot control the orientation of the end-effector, e.g., because the end-effector is mechanically constrained to point radially, the misalignment of the payload on the robot end-effector can be compensated only partially for by adjusting the destination position of the robot end-effector according to the following expressions:

$$x_{adj}=, y_{adj}= \quad (37)$$

where $x_{adj}$ and $y_{adj}$ are Cartesian coordinates of the adjusted destination position of the robot end-effector in the robot coordinate system, and $x_{stn}$ and $y_{stn}$ are Cartesian coordinates of the robot station in the robot coordinate system. The adjusted destination position of the robot end-effector may be obtained in terms of polar coordinates as follows:

$$r_{adj}=\sqrt{r_{stn}^2-x_c^2}-y_c, \phi_{adj}=\phi_{stn}-a\sin(x_c/r_{stn}) \quad (38)$$

where $r_{adj}$ and $\phi_{adj}$ are polar coordinates of the adjusted destination position of the robot end-effector in the robot coordinate system, and $r_{stn}$ and $\phi_{stn}$ are polar coordinates of the robot station in the robot coordinate system.

In summary, the method for determining a position of a polygonal payload on a robot end-effector and, if configured so, for utilizing the position for delivering the payload to a specified location may include the following steps:

The robot moves a payload through one or more sensors, which are configured to detect edges of the payload.

The direction of motion changes at least ones between the edge detection events so that at least three points on at least two edges, which are not parallel, are detected.

The robot controller captures (directly or indirectly using available position measurements) the position of the end-effector when any sensor detects any edge of the payload.

The robot controller converts the captured end-effector positions to points on the circumference of the payload in the end-effector coordinate system.

The robot controller estimates the location of a reference point on the payload in the end-effector coordinate system.

If configured so, the controller estimates the orientation of the payload in the end-effector coordinate system.

If configured so, the controller adjusts the destination (e.g., extended) position of the robot to deliver the payload to a specified location (regardless of the payload misalignment).

If configured so, the controller adjusts the orientation of the end-effector in the destination (e.g., extended) position of the robot to deliver the payload with a specified orientation.

It should be noted that although the present invention is described based on a selected example embodiment, the invention may be practiced in a variety of alternative embodiments. In particular, the following should be noted:

p Although the above examples discuss a rectangular payload, the payload may have any polygonal shape.

Although the above examples utilize a pair of sensors per station, one, three or any suitable number of sensors may be used.

Although the above examples discuss the estimation of the payload location during an extend move, the estimation may be performed during a retract move or any other move.

Although the above examples show a motion path based on four via-points (direction changes), any suitable number of via-points, including a single via-point, may be utilized.

Although the above text presents the use of via-points as an example method for producing the motion path, any suitable method for producing the motion path may be used.

Although the example calculations determine the position of the payload on the end-effector and then use this information to adjust the extended position to deliver the payload to a specified location, the adjusted extended position may be determined directly.

Although the above examples show a robot with an end-effector constrained to point radially, the robot may have an articulated end-effector (actively controlled wrist joint).

If the robot has an articulated end-effector, the end-effector may be maintained in an orientation parallel to the direct path to the station to minimize payload rotation.

Alternatively, if the robot has an articulated end-effector, the end-effector may be rotate during motion to obtain the best estimate of the location of the payload on the end-effector.

Although the above examples discuss a robot with a single arm with a single end-effector, the robot may feature multiple arms and multiple end-effectors.

Figure 9:
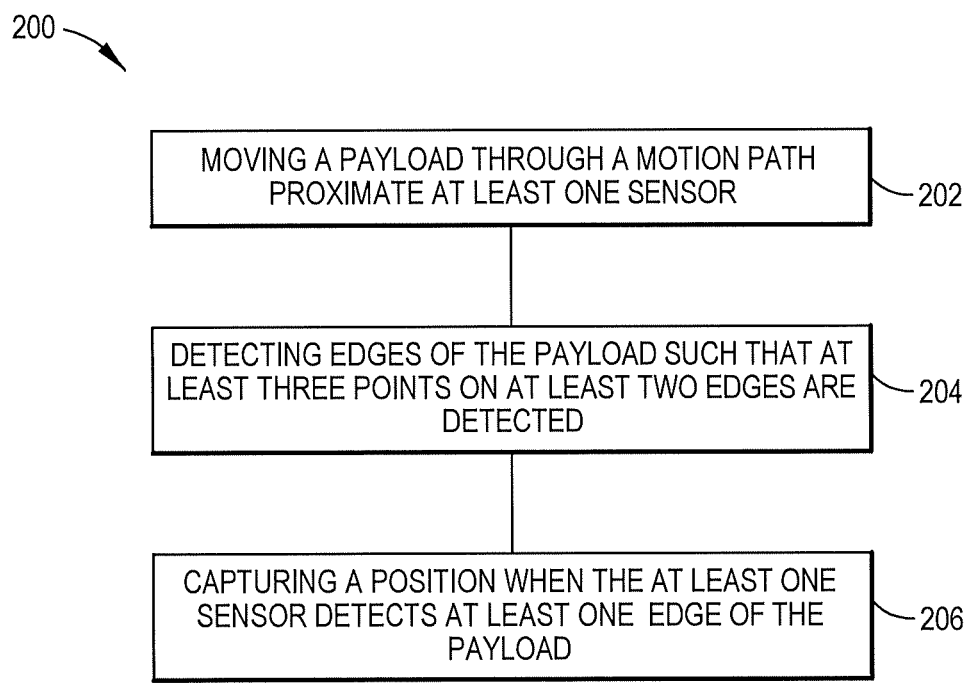
FIG. 9 is a diagram illustrating an example method.

An example method 200 is shown in FIG. 9 which includes moving a payload through a motion path proximate at least one sensor (see block 202); detecting edges of the payload such that at least three points on at least two edges are detected (see block 204); and capturing a position when the at least one sensor detects at least one edge of the payload (see block 206).

An example apparatus may comprise an end-effector configured to move a payload; at least one sensor configured to detect edges of the payload; and a controller 34 comprising at least one processor 36 and at least one non-transitory memory 38 including computer program code, the at least one memory and the computer program code configured to, with the at least one processor, cause the apparatus to: move the payload through a motion path proximate the at least one sensor; detect the edges of the payload such that at least three points on at least two edges are detected; and_capture a position when the at least one sensor detects at least one edge of the payload.

Figure 2:
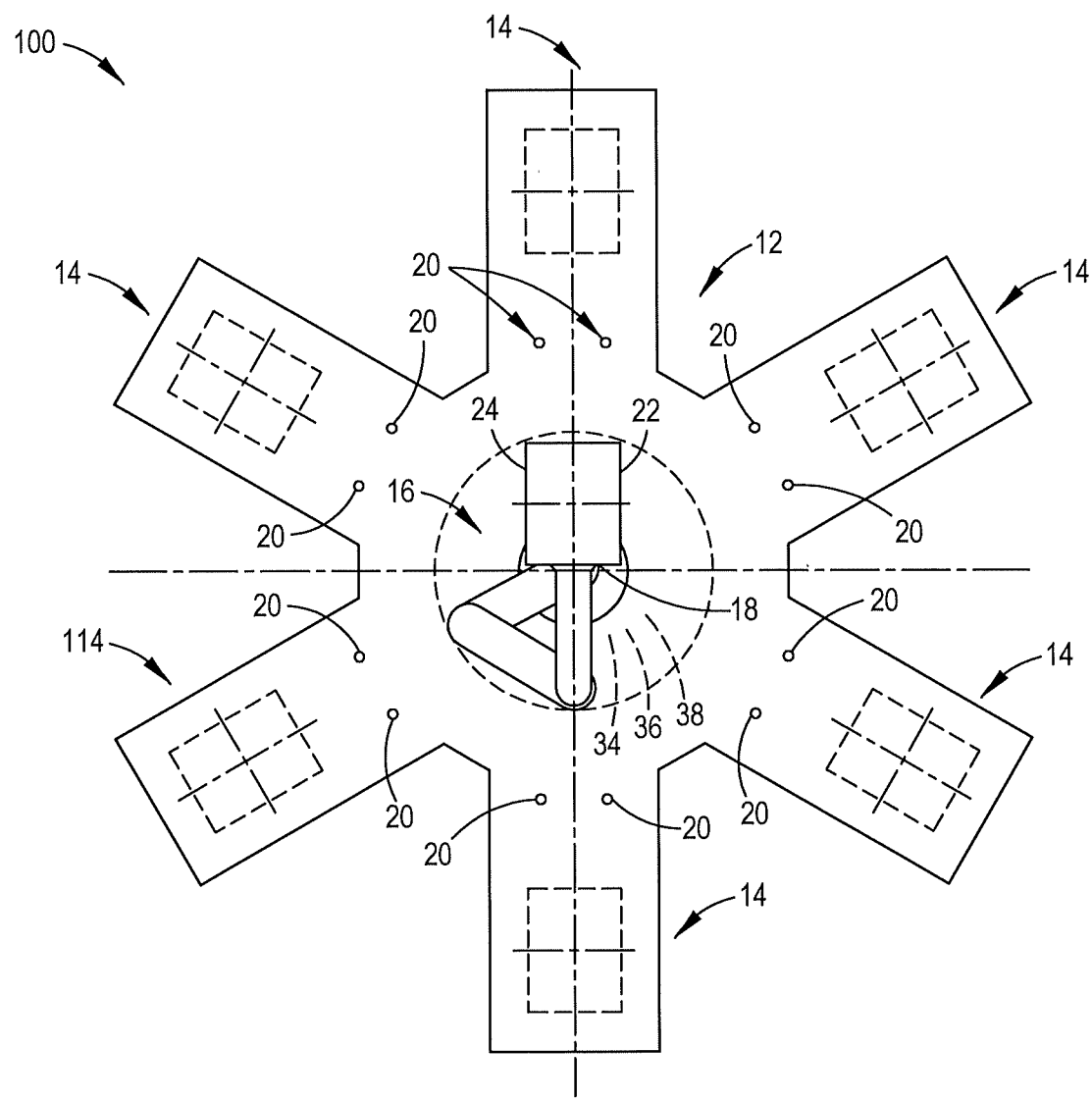
FIG. 2 is a top view of a cluster tool incorporating features of the invention.
Figure 3D:
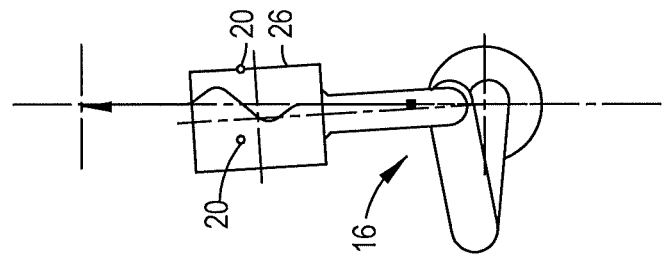
FIG. 3 shows various motion paths of a robot of the cluster tool of FIG. 2.
Figure 3C:
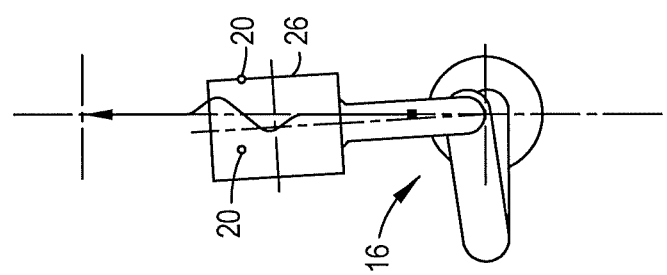
Figure 3B:
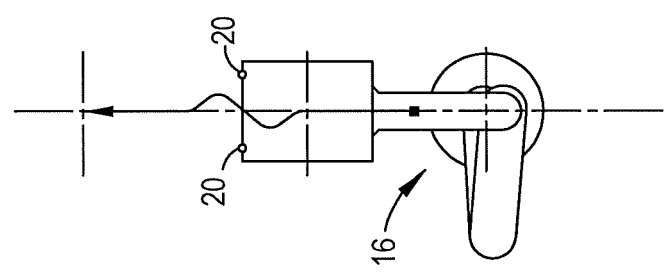
Figure 3A:
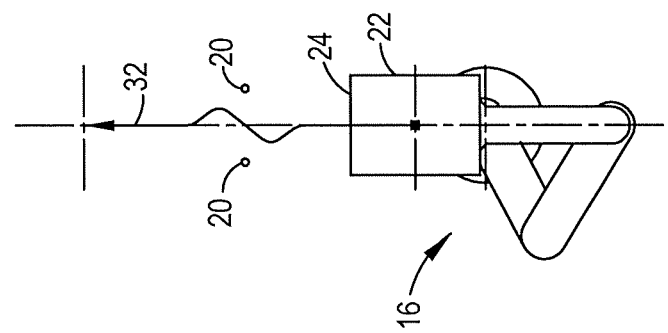
Figure 3H:
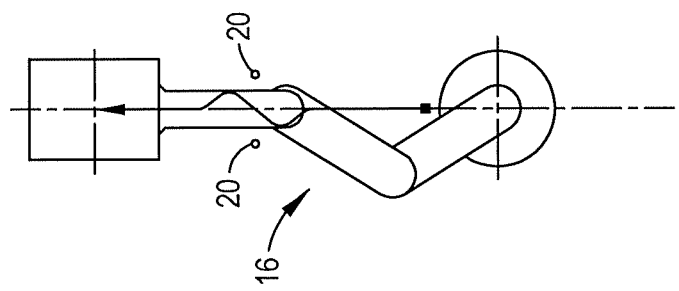
Figure 3G:
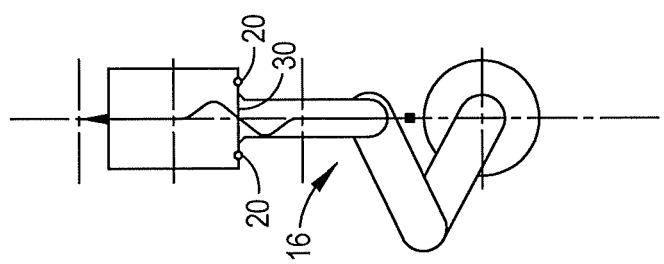
Figure 3F:
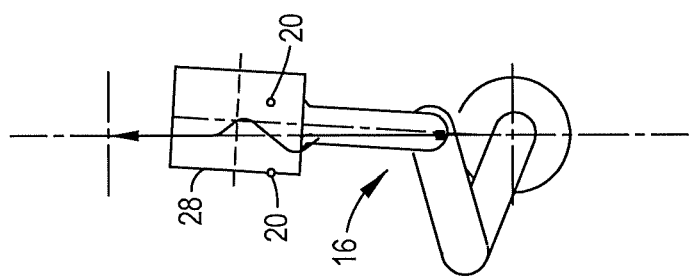
Figure 3E:
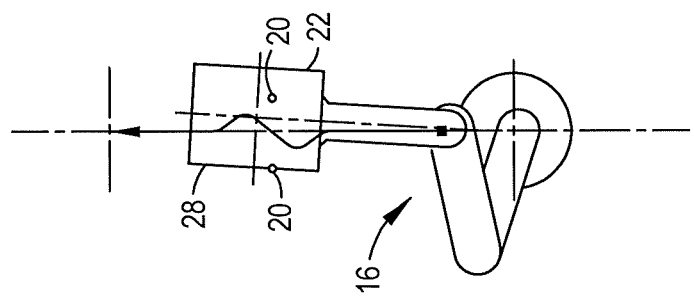

An example may be provided in a non-transitory program storage device, such as memory 38 shown in FIG. 2 for example, readable by a machine, tangibly embodying a program of instructions executable by the machine for performing operations comprising moving a payload through a motion path proximate at least one sensor, detecting edges of the payload such that at least three points on at least two edges are detected, and capturing a position when the at least one sensor detects at least one edge of the payload.

Any combination of one or more computer readable medium(s) may be utilized as the memory. The computer readable medium may be a computer readable signal medium or a non-transitory computer readable storage medium. A non-transitory computer readable storage medium does not include propagating signals and may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. A method comprising:
   moving a payload through a motion path proximate at least one sensor;
   detecting edges of the payload such that at least three points on at least two edges are detected;
   using the detected at least three points to determine a position of the payload; and
   capturing a position of an end-effector carrying the payload when the at least one sensor detects at least one edge of the payload;
   wherein using the detected at least three points to determine the position of the payload comprises fitting edges of a rectangle to the at least three points, determining a positional offset and a rotational offset of the rectangle, and using the positional offset and the rotational offset to capture an adjusted destination position of the end-effector.

2. A method as in claim 1 wherein the at least three points are on at least two non-parallel edges.

3. A method as in claim 1 wherein the at least one sensor is configured to detect the edges of the payload when direction of motion changes between edge detection events.

4. A method as in claim 1 wherein the capturing further comprises capturing, directly or indirectly using available position measurements, the position when the at least one sensor detects the at least one edge of the payload.

5. A method as in claim 1 further comprising converting points on a circumference of the payload to an end-effector coordinate system.

6. A method as in claim 5 further comprising estimating a location of a reference point on the payload in the end-effector coordinate system.

7. A method as in claim 5 further comprising estimating an orientation of the payload in the end-effector coordinate system.

8. A method as in claim 7 further comprising adjusting a destination position of a robot to deliver the payload to a specified location.

9. A method as in claim 8 further comprising adjusting the orientation of the end-effector in the destination position of the robot to deliver the payload with a specified orientation.

10. An apparatus comprising:
    an end-effector configured to move a payload;
    at least one sensor configured to detect edges of the payload; and
    a controller comprising at least one processor and at least one non-transitory memory including computer program code, the at least one memory and the computer program code configured to, with the at least one processor, cause the apparatus to:
    move the payload through a motion path proximate the at least one sensor;
    detect the edges of the payload such that at least three points on at least two edges are detected;
    use the detected at least three points to determine a position of the payload; and
    capture a position of an end-effector carrying the payload when the at least one sensor detects at least one edge of the payload;
    wherein causing the apparatus to use the detected at least three points to determine the position of the payload comprises fitting edges of a rectangle to the at least three points, determining a positional offset and a rotational offset of the rectangle, and using the positional offset and the rotational offset to capture an adjusted destination position of the end-effector.

11. An apparatus as in claim 10 wherein the apparatus is a vacuum chamber comprising a plurality of stations attached to a circumference of the vacuum chamber.

12. An apparatus as in claim 11 wherein the apparatus comprises two sensors per station.

13. An apparatus as in claim 10 wherein the at least one sensor comprises an optical through-beam sensor or an optical reflective sensor.

14. An apparatus as in claim 10 wherein the at least one memory and the computer program code are configured to, with the at least one processor, cause the apparatus to convert captured end-effector positions to points on a circumference of the payload in an end-effector coordinate system.

15. An apparatus as in claim 14 wherein the at least one memory and the computer program code are configured to, with the at least one processor, cause the apparatus to estimate a location of a reference point on the payload in the end-effector coordinate system.

16. A non-transitory program storage device readable by a machine, tangibly embodying a program of instructions executable by the machine for performing operations comprising:
    moving a payload through a motion path proximate at least one sensor;
    detecting edges of the payload such that at least three points on at least two edges are detected;
    using the detected at least three points to determine a position of the payload; and
    capturing a position of an end-effector carrying the payload when the at least one sensor detects at least one edge of the payload;

wherein using the detected at least three points to determine the position of the payload comprises fitting edges of a rectangle to the at least three points, determining a positional offset and a rotational offset of the rectangle, and using the positional offset and the rotational offset to capture an adjusted destination position of the end-effector.

17. A non-transitory program storage device as in claim 16 further comprising a program of instructions executable by the machine for performing operations comprising converting captured end-effector positions to points on a circumference of the payload in an end-effector coordinate system.

18. A non-transitory program storage device as in claim 17 further comprising a program of instructions executable by the machine for performing operations comprising estimating a location of a reference point on the payload in the end-effector coordinate system.

19. A non-transitory program storage device as in claim 17 further comprising a program of instructions executable by the machine for performing operations comprising estimating an orientation of the payload in the end-effector coordinate system.

20. A non-transitory program storage device as in claim 19 further comprising a program of instructions executable by the machine for performing operations comprising adjusting a destination position of a robot to deliver the payload to a specified location.

* * * * *